US011502165B2

(12) United States Patent
Chou

(10) Patent No.: US 11,502,165 B2
(45) Date of Patent: Nov. 15, 2022

(54) SEMICONDUCTOR DEVICE WITH FLOWABLE LAYER AND METHOD FOR FABRICATING THE SAME

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 138 days.

(21) Appl. No.: 16/923,684

(22) Filed: Jul. 8, 2020

(65) Prior Publication Data
US 2022/0013629 A1  Jan. 13, 2022

(51) Int. Cl.
*H01L 29/06* (2006.01)
*H01L 21/762* (2006.01)

(52) U.S. Cl.
CPC .... *H01L 29/0649* (2013.01); *H01L 21/76229* (2013.01)

(58) Field of Classification Search
CPC ......... H01L 21/76229; H01L 21/02164; H01L 21/02304; H01L 21/02271; H01L 21/02211; H01L 29/0649; H01L 21/0214; H01L 21/02274; H01L 27/10873; H01L 21/76224; H01L 21/76283; H01L 27/10802; H01L 27/10894; H01L 27/10844; H01L 27/10897; H01L 21/0234; H01L 21/0228; H01L 21/0217; H01L 21/31055; H01L 27/11531; H01L 27/10885; H01L 21/76237; H01L 21/02323; H01L 21/02312; H01L 27/10891; H01L 21/02307; H01L 27/10876; H01L 21/0206; H01L 21/02282; H01L 21/02337; H01L 27/10814; H01L 21/823431; H01L 21/823481; H01L 27/0886; H01L 21/31053; H01L 21/02238; H01L 21/762; H01L 21/76232;
(Continued)

(56) References Cited

U.S. PATENT DOCUMENTS 5,492,858 A * 2/1996 Bose ................. H01L 21/76229
257/E21.548
5,702,977 A * 12/1997 Jang .................. H01L 21/76224
257/E21.546
6,444,541 B1    9/2002 Lai et al.
(Continued)

FOREIGN PATENT DOCUMENTS

TW  200610096 A   3/2006
TW  201703155 A   1/2017

*Primary Examiner* — Mouloucoulaye Inoussa
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a first isolation layer positioned in the substrate, a first treated flowable layer positioned between the first isolation layer and the substrate, a second isolation layer positioned in the substrate, and a second treated flowable layer positioned between the second isolation layer and the substrate. A width of the first isolation layer is greater than a width of the second isolation layer, and a depth of the first isolation layer is less than a depth of the second isolation layer.

10 Claims, 15 Drawing Sheets

(58) Field of Classification Search
CPC ......... H01L 27/10823; H01L 27/10855; H01L 27/10888
USPC ....... 257/315, 506, 427, 510, 499, 316, 618, 257/321, 296, 513, E21.546, E29.005, 257/E29.3; 438/435, 790, 438, 427, 443, 438/296, 241, 258, 400, 201, 257, 424, 438/437, 699, 692
See application file for complete search history.

(56) References Cited

U.S. PATENT DOCUMENTS

| | | | |
|---|---|---|---|
| 8,823,132 B2 | 9/2014 | Liou et al. | |
| 8,912,074 B2 | 12/2014 | Liou et al. | |
| 9,337,260 B2 | 5/2016 | Liou et al. | |
| 9,881,918 B1* | 1/2018 | Huang | H01L 21/30604 |
| 2002/0076900 A1* | 6/2002 | Park | H01L 21/76229 |
| | | | 438/424 |
| 2004/0032006 A1* | 2/2004 | Yun | H01L 21/76229 |
| | | | 438/258 |
| 2005/0009293 A1* | 1/2005 | Kim | H01L 21/76229 |
| | | | 438/424 |
| 2005/0016948 A1* | 1/2005 | Yang | H01L 21/76232 |
| | | | 257/E21.549 |
| 2005/0287731 A1* | 12/2005 | Bian | H01L 29/42324 |
| | | | 438/257 |
| 2006/0151866 A1* | 7/2006 | Lee | G01R 31/3172 |
| | | | 257/686 |
| 2006/0223279 A1* | 10/2006 | Patraw | H01L 21/76229 |
| | | | 438/782 |
| 2007/0210403 A1* | 9/2007 | Sandhu | H01L 27/105 |
| | | | 257/E27.081 |
| 2008/0020534 A1* | 1/2008 | Culmsee | H01L 21/76229 |
| | | | 438/296 |
| 2008/0166854 A1* | 7/2008 | Shin | H01L 21/76229 |
| | | | 257/E21.549 |
| 2008/0169499 A1* | 7/2008 | Kiyotoshi | H01L 27/105 |
| | | | 438/257 |
| 2008/0176379 A1* | 7/2008 | Lee | H01L 27/1052 |
| | | | 438/443 |
| 2008/0182381 A1* | 7/2008 | Kiyotoshi | H01L 21/76229 |
| | | | 257/E21.546 |
| 2009/0124061 A1* | 5/2009 | Kiyotoshi | H01L 27/11531 |
| | | | 257/E21.546 |
| 2009/0162989 A1* | 6/2009 | Cho | H01L 21/76229 |
| | | | 257/E21.546 |
| 2011/0024822 A1* | 2/2011 | Sandhu | H01L 27/11531 |
| | | | 257/E29.02 |
| 2012/0132976 A1* | 5/2012 | Kim | H01L 27/105 |
| | | | 257/315 |
| 2012/0282777 A1* | 11/2012 | Shih | H01L 21/02164 |
| | | | 257/E21.24 |
| 2014/0159193 A1* | 6/2014 | Kim | H01L 27/10844 |
| | | | 257/513 |
| 2015/0137309 A1* | 5/2015 | Tilke | H01L 21/76229 |
| | | | 257/506 |
| 2015/0270337 A1* | 9/2015 | Ujihara | H01L 21/76224 |
| | | | 257/510 |
| 2017/0018552 A1* | 1/2017 | Moon | H01L 21/02238 |
| 2018/0040505 A1 | 2/2018 | Gaan et al. | |
| 2018/0315853 A1* | 11/2018 | Yu | H01L 27/1104 |

\* cited by examiner

SEMICONDUCTOR DEVICE WITH FLOWABLE LAYER AND METHOD FOR FABRICATING THE SAME

TECHNICAL FIELD

The present disclosure relates to a semiconductor device and a method for fabricating the semiconductor device with a flowable layer, and more particularly, to a semiconductor device with the flowable layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first isolation layer positioned in the substrate, a first treated flowable layer positioned between the first isolation layer and the substrate, a second isolation layer positioned in the substrate, and a second treated flowable layer positioned between the second isolation layer and the substrate. A width of the first isolation layer is greater than a width of the second isolation layer, and a depth of the first isolation layer is less than a depth of the second isolation layer.

In some embodiments, an aspect ratio of the first isolation layer is between about 1:4 and about 1:8 and an aspect ratio of the second isolation layer is between about 1:6 and about 1:12.

In some embodiments, the semiconductor device includes a first adhesion layer positioned between the first isolation layer and the first treated flowable layer and a second adhesion layer positioned between the second isolation layer and the second treated flowable layer.

In some embodiments, the semiconductor device includes first adjustment layers positioned between the first isolation layer and the first treated flowable layer and positioned on sidewalls of the first treated flowable layer Widths of the first adjustment layers are gradually decreased from top to bottom.

In some embodiments, top surfaces of the first adjustment layers are substantially coplanar with a top surface of the first isolation layer, and a depth of the first adjustment layers is less than or equal to one half of the depth of the first isolation layer.

In some embodiments, the first adjustment layers are formed of aluminum oxide, hafnium oxide, zirconium oxide, titanium oxide, titanium nitride, tungsten nitride, silicon nitride, or silicon oxide.

In some embodiments, sidewalls of the first isolation layer are tapered.

In some embodiments, an angle between the sidewalls of the first isolation layer and a top surface of the first isolation layer is between 80 degree and about 90 degree.

Another aspect of the present disclosure provides a method for fabricating a semiconductor device including providing a substrate, forming a first trench and a second trench in the substrate, conformally forming a flowable layer on a top surface of the substrate and in the first trench and the second trench, performing a thermal process to turn the flowable layer into a processed flowable layer, forming a layer of isolation material on the processed flowable layer to completely fill the first trench and the second trench, and performing a planarization process to turn the layer of isolation material into a first isolation layer in the first trench and a second isolation layer in the second trench, and turn the processed flowable layer into a first treated flowable layer in the first trench and a second treated flowable layer in the second trench. The first trench and the second trench have different aspect ratios.

In some embodiments, the method for fabricating the semiconductor device includes a step of conformally forming a layer of adhesion material on the top surface of the substrate and in the first trench and the second trench before the step of forming the flowable layer on the top surface of the substrate and in the first trench and the second trench. The flowable layer is formed on the layer of adhesion material.

In some embodiments, the flowable layer includes compounds having unsaturated bonding.

In some embodiments, the processed flowable layer includes silicon oxide, silicon nitride, silicon oxynitride, or silicon nitride oxide.

In some embodiments, the layer of adhesion material includes silicon oxide.

In some embodiments, the flowable layer is formed from flowable precursors, and the flowable precursor includes silane, disilane, trisilane, hexasilane, cyclohexasilane, methylsilane, triethoxysilane, or bis-tert-butylamino silane.

In some embodiments, the flowable precursors are mixed with an oxidant to form the flowable layer, the oxidant is peroxide, ozone, oxygen, or steam.

In some embodiments, a process temperature of the thermal process is between about 100° C. and about 400° C.

In some embodiments, a substrate temperature during the step of conformally forming a flowable layer on the top surface of the substrate and in the first trench and the second trench is less than 120° C.

In some embodiments, the layer of isolation material includes silicon oxide, silicon nitride, silicon oxynitride, silicon nitride oxide, or fluoride-doped silicate.

In some embodiments, the method for fabricating the semiconductor device includes a step of forming a layer of adjustment material covering the top surface of the substrate and upper portions of sidewalls of the first trench and the second trench before the step of forming the layer of isolation material on the processed flowable layer to completely fill the first trench and the second trench.

In some embodiments, the layer of adjustment material includes aluminum oxide, hafnium oxide, zirconium oxide, titanium oxide, titanium nitride, tungsten nitride, silicon nitride, or silicon oxide.

Due to the design of the semiconductor device of the present disclosure, the first treated flowable layer and the second treated flowable layer may fill small substrate gaps without forming voids or weak seams. Therefore, the yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
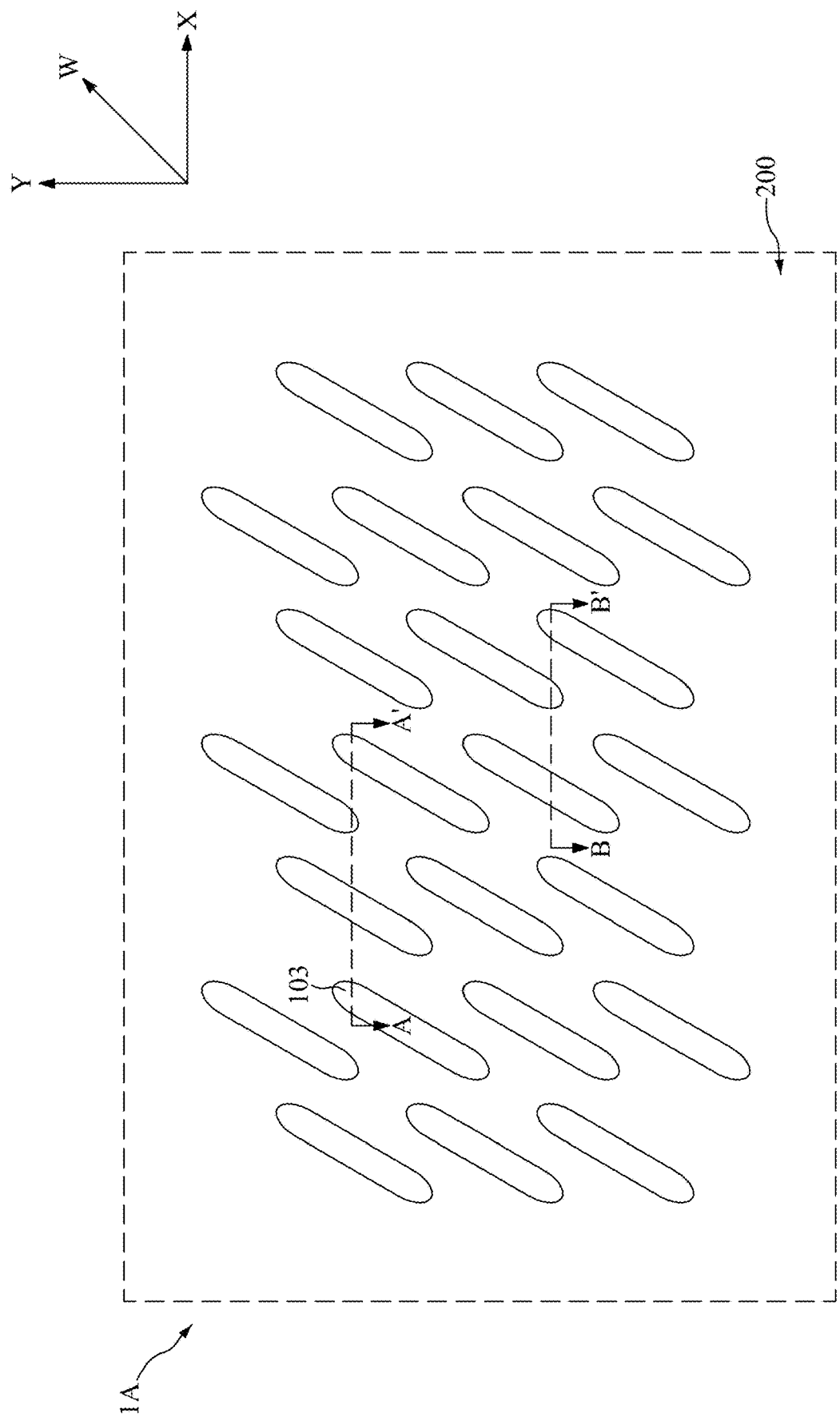
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
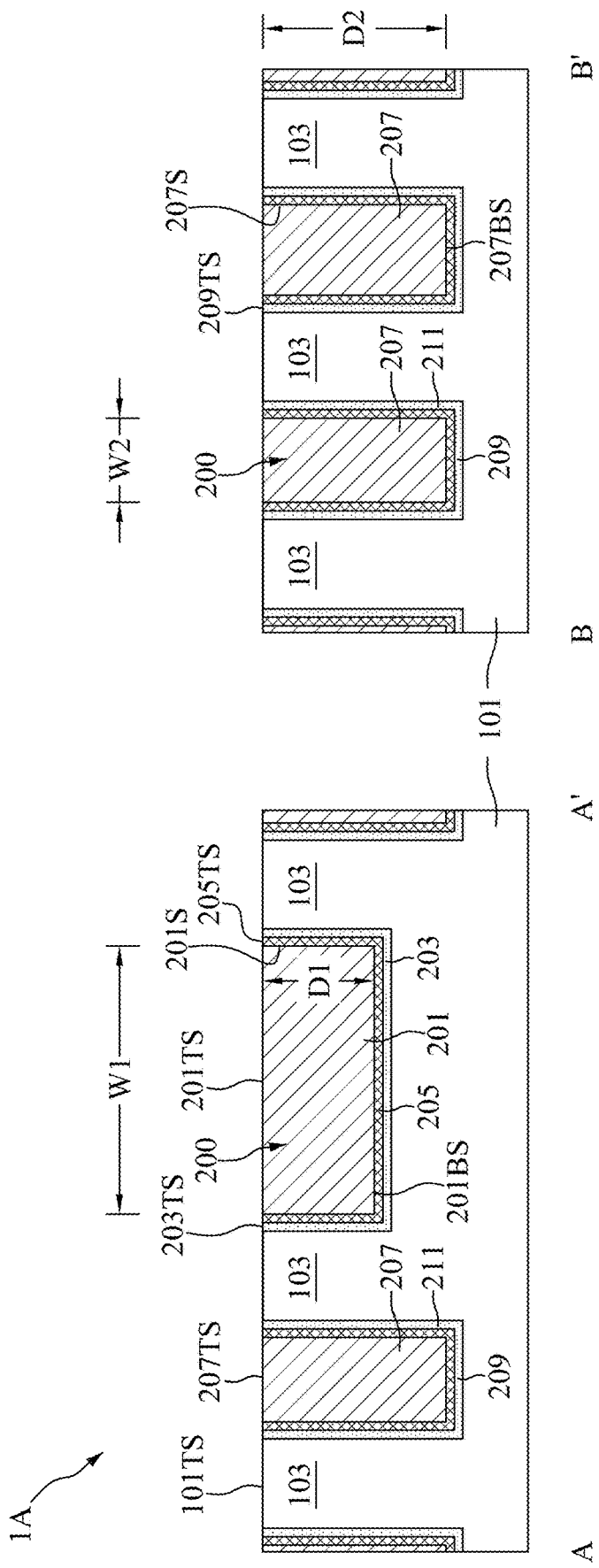
FIG. 2 is a schematic cross-sectional view diagram taken along lines A-A' and B-B' in FIG. 1.

FIG. 1 illustrates, in a schematic top-view diagram, a semiconductor device 1A in accordance with one embodiment of the present disclosure. FIG. 2 is a schematic cross-sectional view diagram taken along lines A-A' and B-B' in FIG. 1.

With reference to FIGS. 1 and 2, the semiconductor device 1A may include a substrate 101, an isolation structure 200, and device elements (not shown).

With reference to FIGS. 1 and 2, the substrate 101 may be formed of, for example, silicon, germanium, silicon germanium, silicon carbon, silicon germanium carbon, gallium, gallium arsenide, indium arsenide, indium phosphorus or other IV-IV, III-V or II-VI semiconductor materials. In some embodiments, the substrate 101 may include an organic semiconductor or a layered semiconductor such as silicon/silicon germanium, silicon-on-insulator, or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride, or any combination thereof.

With reference to FIGS. 1 and 2, the isolation structure 200 may be disposed in the substrate 101 and may surround portions of the substrate 101 to define active regions 103 in the substrate 101. In a top-view perspective, the active regions 103 may have bar shapes which are extended in a direction W. The active regions 103 may be parallel to each other.

It should be noted that the active region 103 may comprise a portion of the substrate 101 and a space above the portion of the substrate 101. Describing an element as being disposed on the active region 103 means that the element is disposed on a top surface of the portion of the substrate 101. Describing an element as being disposed in the active region 103 means that the element is disposed in the portion of the substrate 101; however, a top surface of the element may be even with the top surface of the portion of the substrate 101. Describing an element as being disposed above the active region 103 means that the element is disposed above the top surface of the portion of the substrate 101.

The device elements may be disposed in the active regions 103 or on the active regions 103. The device elements may be bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices but are not limited thereto. For example, the device elements may be buried word lines of the dynamic random-access memories and may be disposed in the active regions 103. For another example, the device elements may be gate structures of the metal-oxide-semiconductor field effect transistors and may be disposed on the active regions 103.

With reference to FIG. 2, the isolation structure 200 may include first isolation layers 201, first adhesion layers 203, first treated flowable layers 205, second isolation layers 207, second adhesion layers 209, and second treated flowable layers 211. For convenience of description, only one first isolation layer 201, one first adhesion layer 203, one first treated flowable layer 205, one second isolation layer 207, one second adhesion layer 209, and one second treated flowable layer 211 are described.

With reference to FIG. 2, the first isolation layer 201 may be disposed in the substrate 101. The top surface 201TS may be substantially coplanar with the top surface 101TS of the substrate 101. The first isolation layer 201 may have an aspect ratio between about 1:4 and about 1:8. The sidewalls 201S of the first isolation layer 201 may be substantially vertical. The first isolation layer 201 may be formed of, for example, silicon oxide, silicon nitride, silicon oxynitride, silicon nitride oxide, or fluoride-doped silicate.

It should be noted that a surface is "vertical" if there exists a vertical plane from which the surface does not deviate by more than three times the root mean square roughness of the surface.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 2, the first adhesion layer 203 may be disposed between the substrate 101 and the first isolation layer 201. In some embodiments, the first adhesion layer 203 may be disposed on the sidewalls 201S of the first isolation layer 201 and the bottom surface 201BS of the first isolation layer 201. The top surfaces 203TS of the first adhesion layer 203 may be substantially coplanar with the top surface 201TS of the first isolation layer 201. The first adhesion layer 203 may be formed of, for example, silicon oxide, silicon nitride, silicon oxynitride, or silicon nitride oxide. The first adhesion layer 203 may improve adhesion between and the substrate 101 and the first isolation layer 201 or between the substrate 101 and the first treated flowable layer 205. The first adhesion layer 203 may also reduce incidences of delamination and cracking during formation of the first isolation layer 201 or the first treated flowable layer 205. In some embodiments, the first adhesion layer 203 may be optional.

With reference to FIG. 2, the first treated flowable layer 205 may be disposed between the first adhesion layer 203 and the first isolation layer 201. In some embodiments, the first treated flowable layer 205 may be disposed between the substrate 101 and the first isolation layer 201. In some embodiments, the first treated flowable layer 205 may be disposed on the sidewalls 201TS of the first isolation layer 201 and the bottom surface 201BS of the first isolation layer 201. The top surfaces 205TS of the first treated flowable layer 205 may be substantially coplanar with the top surface 201TS of the first isolation layer 201. In some embodiments, the first treated flowable layer 205 may be formed of, for example, silicon oxide, silicon nitride, silicon oxynitride, or silicon nitride oxide.

With reference to FIG. 2, the second isolation layer 207 may be disposed in the substrate 101. The top surface 207TS of the second isolation layer 207 may be substantially coplanar with the top surface 201TS of the first isolation layer 201. The sidewalls 207S of the second isolation layer 207 may be substantially vertical. The width W1 of the first isolation layer 201 may be greater than a width W2 of the second isolation layer 207. The second isolation layer 207 may have an aspect ratio between about 1:6 and about 1:12. The second isolation layer 207 may be formed of a same material as the first isolation layer 201.

With reference to FIG. 2, the second adhesion layer 209 may be disposed between the substrate 101 and the second isolation layer 207. In some embodiments, the second adhesion layer 209 may be disposed on the sidewalls 207S of the second isolation layer 207 and the bottom surface 207BS of the second isolation layer 207. The top surfaces 209TS of the second adhesion layer 209 may be substantially coplanar with the top surface 207TS of the second isolation layer 207.

The second adhesion layer 209 may be formed of a same material as the first adhesion layer 203. The second adhesion layer 209 may improve adhesion between and the substrate 101 and the second isolation layer 207 or between the substrate 101 and the second treated flowable layer 211. The second adhesion layer 209 may also reduce incidences of delamination and cracking during formation of the second isolation layer 207 or the second treated flowable layer 211. In some embodiments, the second adhesion layer 209 may be optional.

With reference to FIG. 2, the second treated flowable layer 211 may be disposed between the second adhesion layer 209 and the second isolation layer 207. In some embodiments, the second treated flowable layer 211 may be disposed between the substrate 101 and the second isolation layer 207. In some embodiments, the second treated flowable layer 211 may be disposed on the sidewalls 207S of the second isolation layer 207 and the bottom surface 207BS of the second isolation layer 207. The top surfaces 211TS of the second treated flowable layer 211 may be substantially coplanar with the top surface 207TS of the second isolation layer 207. The second treated flowable layer 211 may be formed of a same material as the first treated flowable layer 205.

In some embodiments, the first adhesion layer 203 and the second adhesion layer 209 may be concurrently formed. In some embodiments, the first treated flowable layer 205 and the second treated flowable layer 211 may be concurrently formed. The first treated flowable layer 205 and the second treated flowable layer 211 may be formed from a same flowable layer. In some embodiments, the flowable layer may include compounds having unsaturated bonding such as double bonds or triple bonds. In some embodiments, the flowable layer may include polymer having double bonds. In some embodiments, the flowable layer may include silicon oxide, silicon nitride, silicon oxynitride, or silicon nitride oxide.

Figure 3:
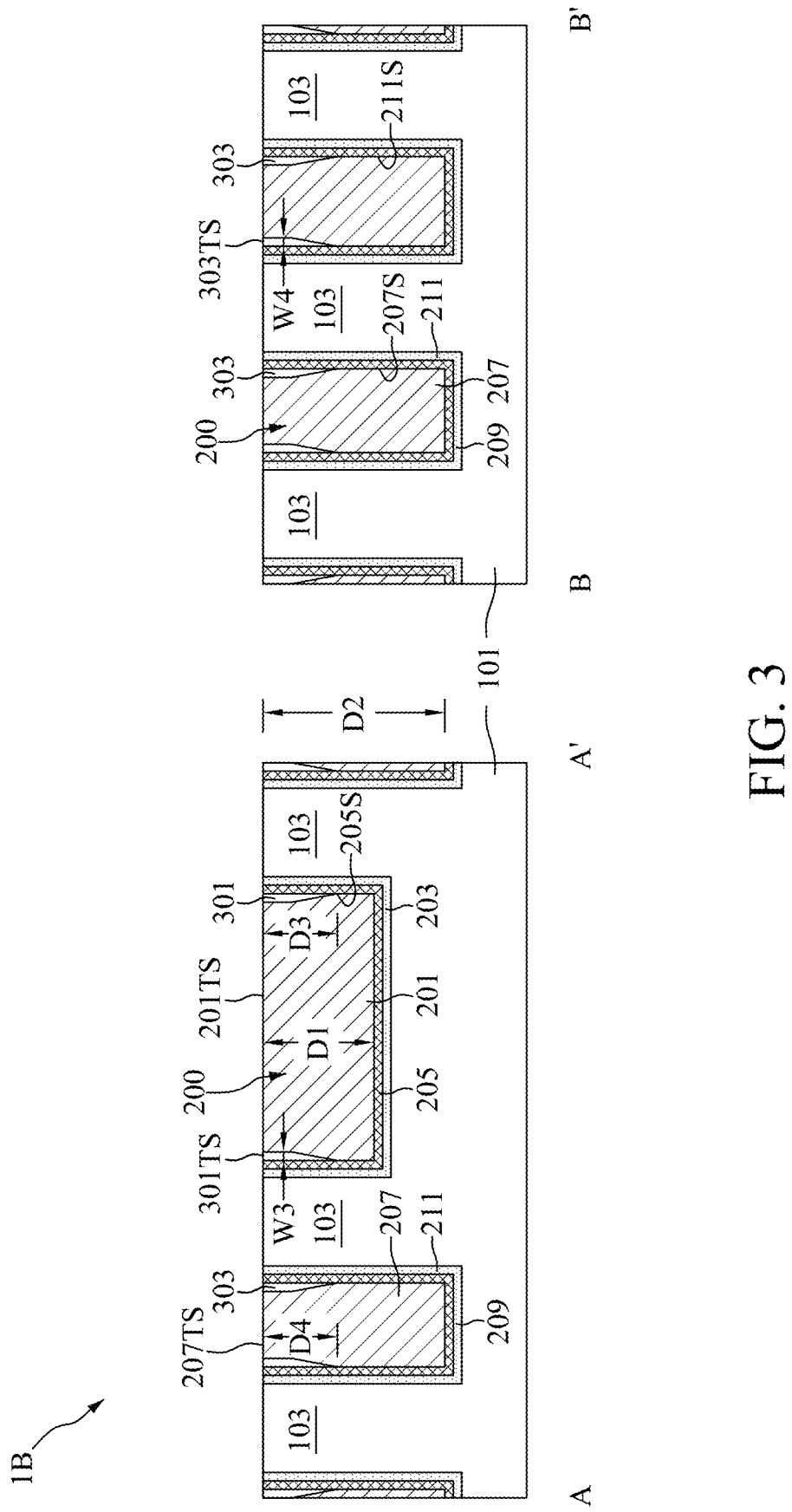
FIGS. 3 and 4 illustrate, in a schematic cross-sectional diagrams, semiconductor devices in accordance with some embodiments of the present disclosure.
Figure 4:
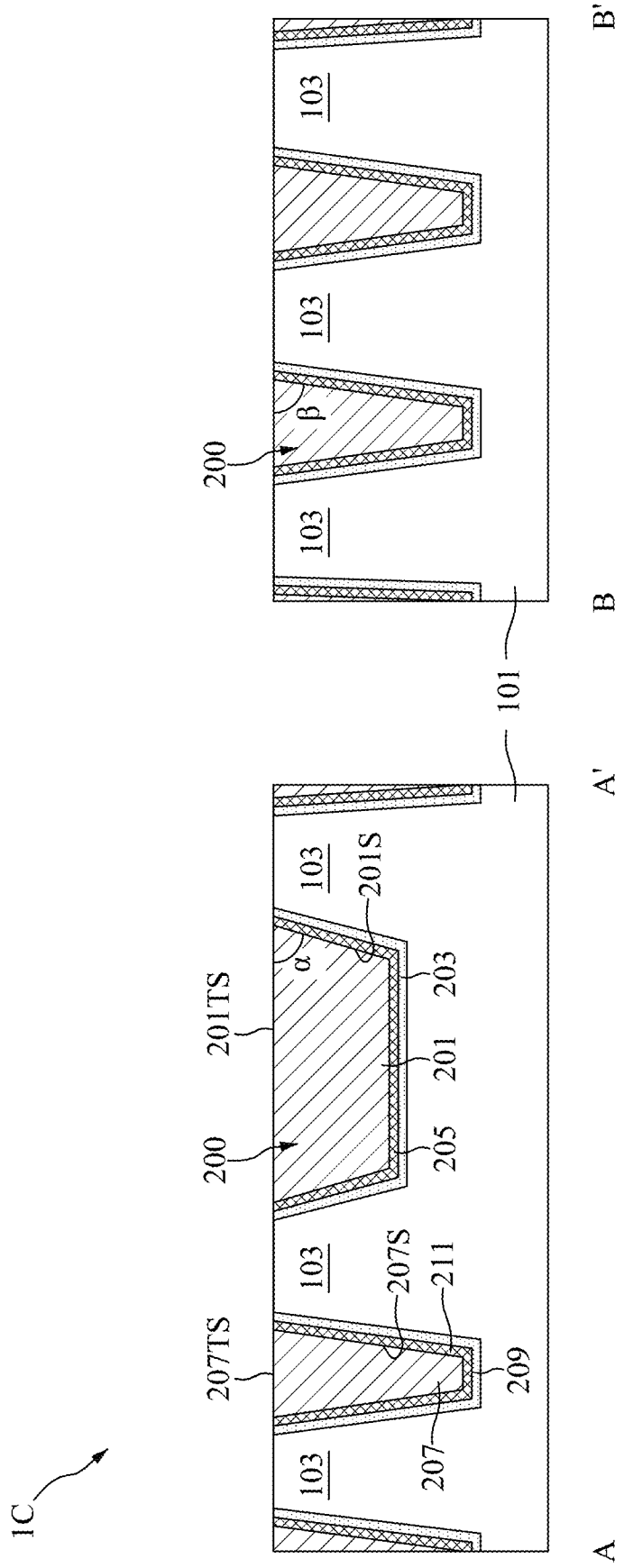

FIGS. 3 and 4 illustrate, in a schematic cross-sectional diagrams, semiconductor devices 1B and 1C in accordance with some embodiments of the present disclosure.

With reference to FIG. 3, the semiconductor device 1B may include first adjustment layers 301 and second adjustment layers 303. The first adjustment layers 301 may be disposed on the sidewalls 205S of the first treated flowable layer 205. In other words, the first adjustment layers 301 may be disposed between the first isolation layer 201 and the first treated flowable layer 205. A width W3 of the first adjustment layers 301 may gradually decrease along the direction Z from top to bottom. The top surfaces 301TS of the first adjustment layers 301 may be substantially coplanar with the top surface 201TS of the first isolation layer 201. A depth D3 of the first adjustment layers 301 may be equal to or less than one half of the depth D1 of the first isolation layer 201. The first adjustment layers 301 may be formed of, for example, aluminum oxide, hafnium oxide, zirconium oxide, titanium oxide, titanium nitride, tungsten nitride, silicon nitride, or silicon oxide.

With reference to FIG. 3, the second adjustment layers 303 may be disposed on the sidewalls 211S of the second treated flowable layer 211. In other words, the second adjustment layers 303 may be disposed between the second isolation layer 207 and the second treated flowable layer 211. A width W4 of the second adjustment layers 303 may gradually decrease along the direction Z from top to bottom. The top surfaces 303TS of the second adjustment layers 303 may be substantially coplanar with the top surface 207TS of the second isolation layer 207. A depth D4 of the second adjustment layers 303 may be less than one half of the depth D2 of the second isolation layer 207. The depth D4 of the second adjustment layers 303 may be equal to the depth D3 of the first adjustment layers 301. The second adjustment layers 303 may be formed of a same material as the first adjustment layers 301. The second adjustment layers 303 and the first adjustment layers 301 may be concurrently formed form a same layer.

With reference to FIG. 4, in the semiconductor device 1C, the sidewalls 201S of the first isolation layer 201 and the sidewalls 207S of the second isolation layer 207 may be tapered. An angle $\alpha$ between the sidewalls 201S of the first isolation layer 201 and the top surface 201TS of the first isolation layer 201 may be between 80 degree and about 90 degree. An angle $\beta$ between the sidewalls 207S of the second isolation layer 207 and the top surface 207TS of the second isolation layer 207 may be between 80 degree and about 90 degree. The angle $\alpha$ may be equal to or less than the angle $\beta$.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 5:
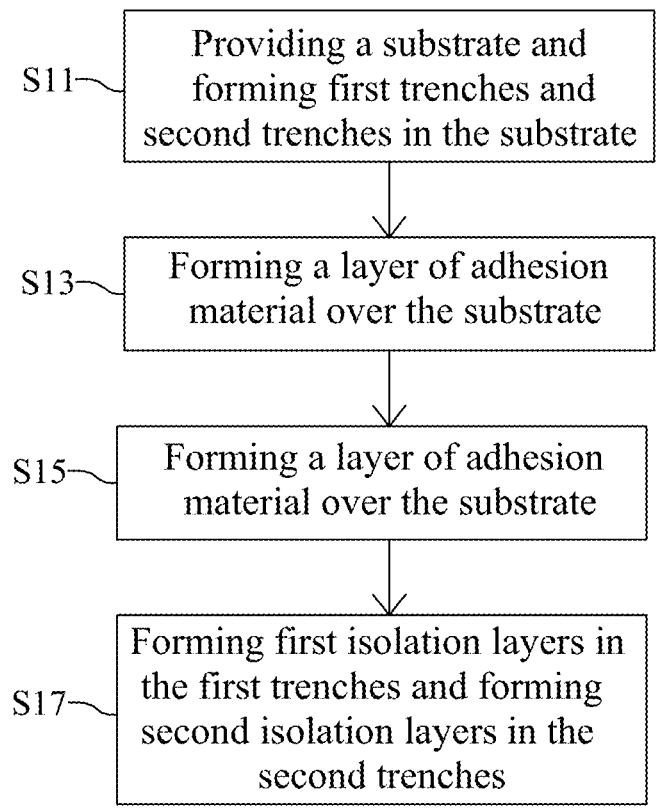
FIG. 5 illustrates, in a flowchart diagram form, a method for fabricating a semiconductor device in accordance with one embodiment of the present disclosure.
Figure 6:
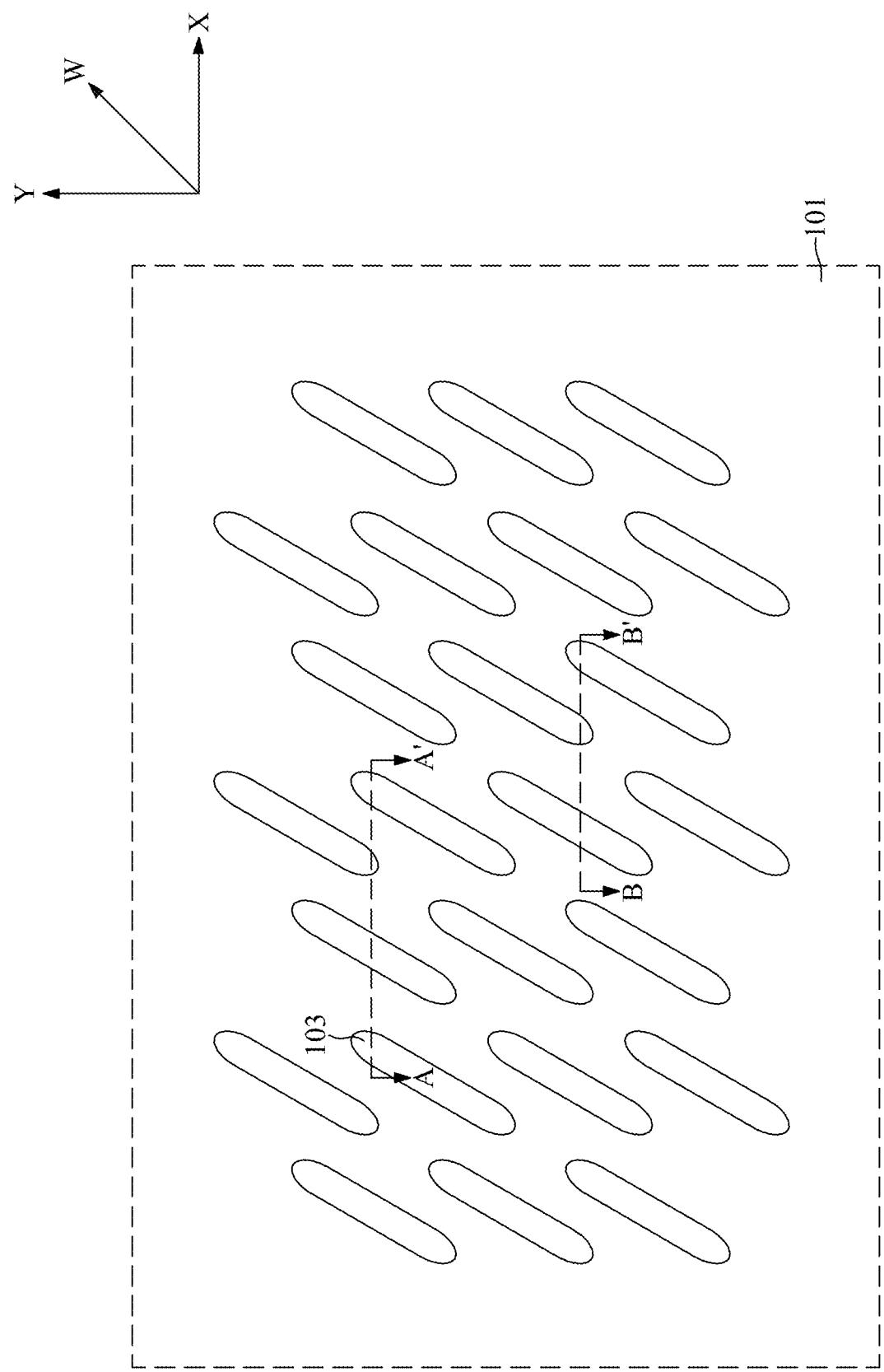
FIG. 6 illustrates, in a schematic top-view diagram, an intermediate semiconductor device in accordance with one embodiment of the present disclosure.

FIG. 5 illustrates, in a flowchart diagram form, a method 10 for fabricating a semiconductor device 1A in accordance with one embodiment of the present disclosure. FIG. 6 illustrates, in a schematic top-view diagram, an intermediate semiconductor device in accordance with one embodiment of the present disclosure. FIGS. 7 to 12 are schematic cross-sectional view diagrams taken along the line A-A' and B-B' in FIG. 6 illustrating part of the flow for fabricating the semiconductor device 1A in accordance with one embodiment of the present disclosure.

Figure 7:
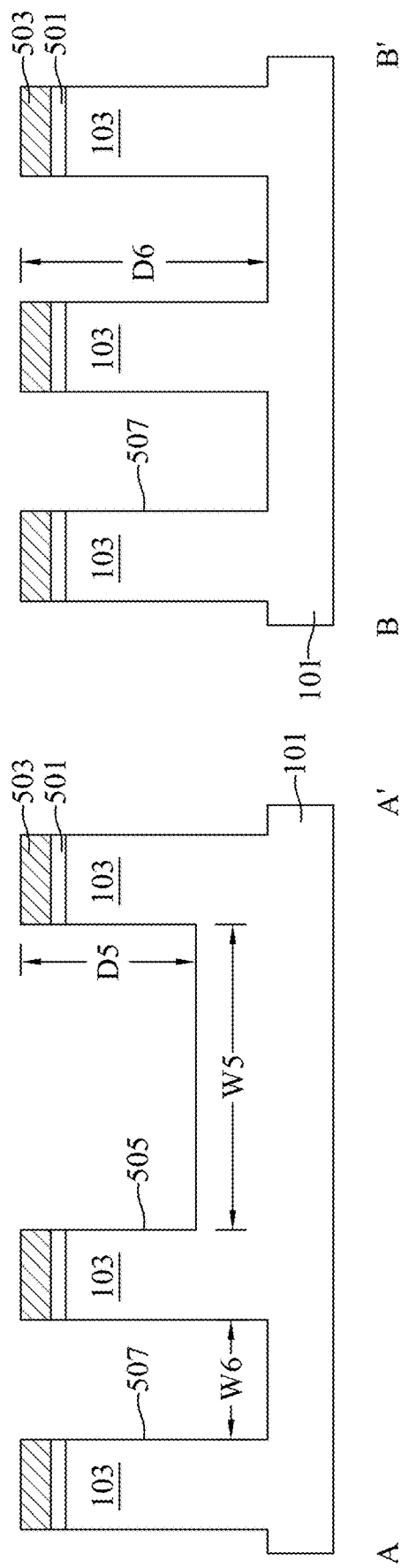
FIGS. 7 to 12 are schematic cross-sectional view diagrams taken along the line A-A' and B-B' in FIG. 6 illustrating part of the flow for fabricating the semiconductor device in accordance with one embodiment of the present disclosure.

With reference to FIGS. 5 to 7, at step S11, a substrate 101 may be provided and first trenches 505 and second trenches 507 may be formed in the substrate 101.

With reference to FIGS. 6 and 7, a series of deposition processes may be performed to deposit a pad oxide layer 501 and a pad nitride layer 503 on the substrate 101. A photolithography process may be performed to define positions of the first trenches 505 and the second trenches 507. After the photolithography process, an etch process, such as an anisotropic dry etch process, may be performed to form trenches penetrating through the pad oxide layer 501, the pad nitride layer 503, and the substrate 101. The first trenches 505 and the second trenches 507 may be formed after the etch process. The first trenches 505 and the second trenches 507 may define active regions 103 of the substrate 101. The pad oxide layer 501 may be formed of, for example, silicon oxide. The pad nitride layer 503 may be formed of, for example, silicon nitride.

For convenience of description, only one first trench 505 and one second trench 507 are described.

With reference to FIG. 7, in some embodiments, a width W5 of the first trench 505 may be greater than a width W6 of the second trench 507. A depth D5 of the first trench 505 may be less than a depth D6 of the second trench 507. In some embodiments, an aspect ratio of the first trench 505 may be between about 1:4 and about 1:8. An aspect ratio of the second trench 507 may be between about 1:6 and about 1:12.

Figure 8:
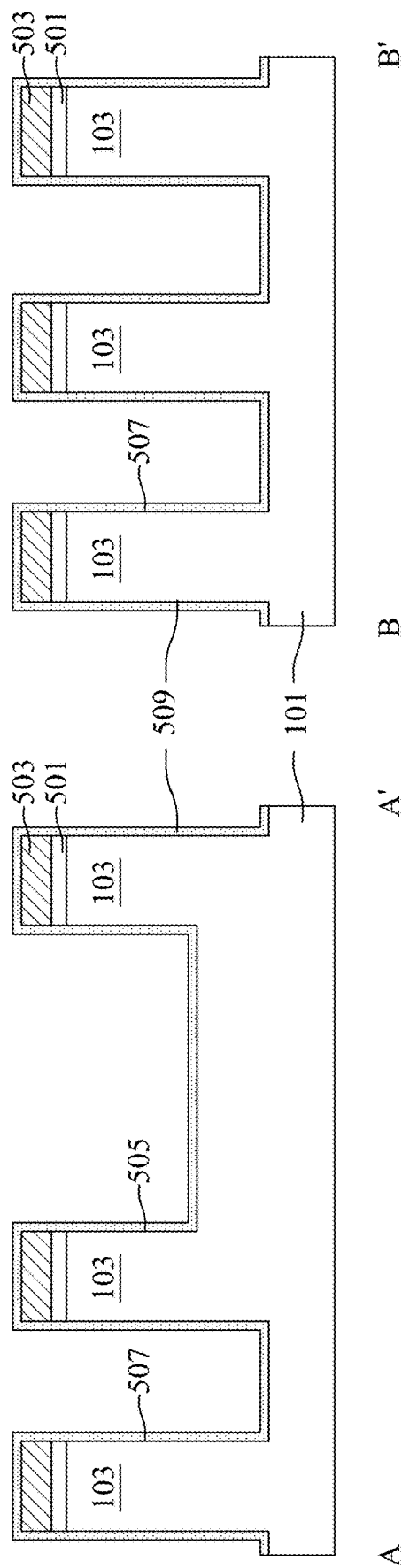

With reference to FIGS. 5 and 8, at step S13, a layer of adhesion material 509 may be formed over the substrate 101.

With reference to FIG. 8, the layer of adhesion material 509 may be formed over the intermediate semiconductor device illustrated in FIG. 7. The layer of adhesion material 509 may be formed in the first trench 505, in the second trench 507, and on the top surface of the pad nitride layer 503. In some embodiments, the adhesion material 509 may be, for example, silicon oxide, silicon oxy nitride, or silicon nitride oxide.

In some embodiments, the layer of adhesion material 509 may be formed by performing a rapid thermal oxidation to the intermediate semiconductor device illustrated in FIG. 7 in an oxide/oxynitride atmosphere. A temperature of the rapid oxidation may be about 1000° C. The corners of the first trenches 505 and the second trenches 507 may be rounded after the rapid thermal oxidation.

Alternatively, in some embodiments, the layer of adhesion material 509 may be formed by a deposition process that concurrently transfers tetraethoxysilane (TEOS) and ozone to the intermediate semiconductor device illustrated in FIG. 7. The substrate temperature during the deposition process may be greater than 400° C., greater than 500° C., or greater than 600° C. Additives such as water (steam), hexamethyl-disilazane (HMDS), and 1,1,3,3-tetramethyldisiloxane (TMDSO) may be added to ensure a more flowable or smooth deposition. Exemplary flow-rates of TEOS may be greater than 0.1 gm/min (grams per minute), greater than 0.5 gm/min, greater than 1 gm/min, or greater than 3 gm/min. Exemplary flow-rates of ozone may be flowed at greater than 1,000 sccm (standard cubic centimeters per minute), greater than 3,000 sccm, greater than 10,000 sccm, or greater than 30,000 sccm. The layer of adhesion material 509 may improve adhesion and reduce incidences of delamination and cracking during and after subsequent processing. In addition, the layer of adhesion material 509 may exhibit a smoother outer surface which may positively affect the deposition dynamics in subsequent processing.

Figure 9:
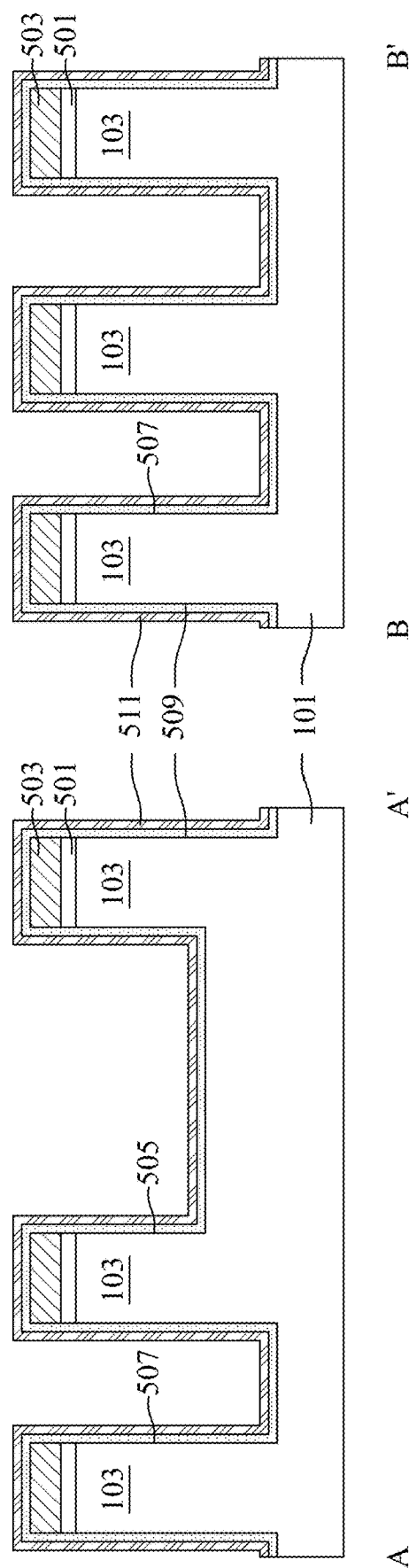
Figure 10:
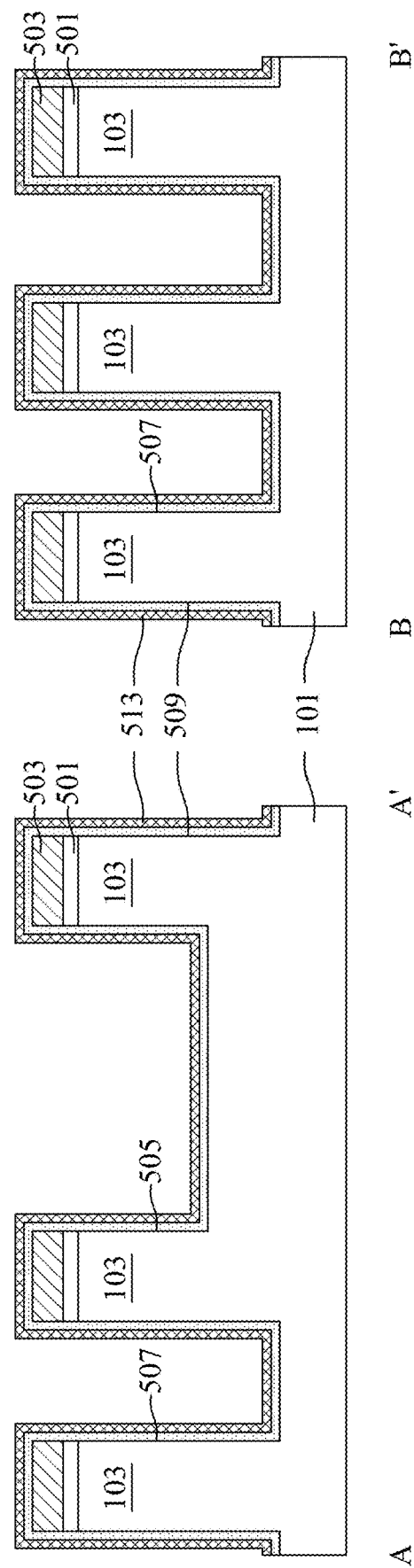

With reference to FIGS. 5, 9, and 10, at step S15, a processed flowable layer 513 may be formed on the layer of adhesion material 509.

With reference to FIG. 9, a flowable layer 511 may be formed on the layer of adhesion material 509. In some embodiments, the flowable layer 511 may include compounds having unsaturated bonding such as double bonds and triple bonds. The flowable layer 511 may be characterized as a soft jelly-like layer, a gel having liquid flow characteristics, or a liquid layer but is not limited thereto. The flowable layer 511 may flow into and fill small substrate gaps without forming voids or weak seams. With reference to FIG. 10, a thermal process may be performed to transform the flowable layer 511 into a processed flowable layer 513 by solidifying the flowable layer 511. The thermal process may break the unsaturated bonding into radicals, and the compounds may cross-link through the radicals. As a result, the flowable layer 511 may be solidified. In some embodiments, the volume of the flowable layer 511 may be reduced during the thermal process. Hence, the processed flowable layer 513 may have greater density comparing to the flowable layer 511.

Alternatively, in some embodiments, the flowable layer 511 may be a flowable silicon-and-nitrogen containing layer. The flowable silicon-and-nitrogen containing layer may be formed by mixing a carbon-free silicon-containing precursor with a radical-nitrogen precursor. The flowable nature of the flowable silicon-and-nitrogen containing layer may allow the flowable silicon-and-nitrogen containing layer to flow into narrow substrate gaps or narrow trenches. The temperature of the substrate 101 during the formation of the flowable silicon-and-nitrogen containing layer may be less than 120° C., less than 100° C., less than 80° C., or less than 60° C.

The carbon-free silicon-containing precursor may be, for example, a silicon-and-nitrogen precursor, a silicon-and-hydrogen precursor, or a silicon-nitrogen-and-hydrogen-containing precursor. In some embodiments, the carbon-free silicon-containing precursor may be also oxygen-free. The lack of oxygen results in a lower concentration of silanol (Si—OH) groups in the flowable silicon-and-nitrogen containing layer formed from the carbon-free silicon-containing precursor. Excess silanol moieties in the flowable silicon-and-nitrogen containing layer may cause increased porosity and shrinkage during subsequent processing that remove the hydroxyl (—OH) moieties from the flowable silicon-and-nitrogen containing layer.

In some embodiments, the carbon-free silicon-containing precursor may include silyl-amines such as $H_2N(SiH_3)$, $HN(SiH_3)_2$, and $N(SiH_3)_3$. The flow rates of a silyl-amines may be greater than or about 200 sccm, greater than or about 300 sccm, or greater than or about 500 sccm. These silyl-amines may be mixed with additional gases that may act as carrier gases, reactive gases, or both. Examples of these additional gases may include $H_2$, $N_2$, $NH_3$, He, and Ar.

In some embodiments, the carbon-free silicon-containing precursor may include silane either alone or mixed with other silicon (e.g., $N(SiH_3)_3$), hydrogen (e.g., $H_2$), and/or nitrogen (e.g., $N_2$, $NH_3$) containing gases.

In some embodiments, the carbon-free silicon-containing precursor may include disilane, trisilane, even higher-order silanes, and chlorinated silanes, alone or in combination with silyl-amines.

The radical-nitrogen precursor may be generated by delivering ammonia to a plasma region. The radical-nitrogen precursor may be subsequently delivered to mix with the carbon-free silicon-containing precursor. The flow rate of delivering ammonia to the plasma region may be greater than or about 300 sccm, greater than or about 500 sccm, or greater than or about 700 sccm. In some embodiments, gases such as nitrogen and hydrogen may be employed to adjust the nitrogen:hydrogen atomic flow ratio. In some embodiments, gases such as helium or argon may be employed as carrier gas for delivering ammonia to the plasma region.

In some embodiments, the radical-nitrogen precursor may be produced without using ammonia. Gases include one or more of hydrogen, nitrogen and hydrazine may be delivered to the plasma region to generate the radical-nitrogen precursor.

Subsequently, a cure process and an anneal process may be sequentially applied to the flowable silicon-and-nitrogen containing layer (i.e., the flowable layer 511) in an oxygen-containing atmosphere to convert the flowable silicon-and-nitrogen containing layer into the processed flowable layer 513 formed of silicon oxide. In some embodiments, the substrate temperature of the cure process may be below or about 400° C. For example, the substrate temperature of the cure process may be between about 100° C. and about 200° C. In some embodiments, the substrate temperature of the anneal process may be between about 500° C. and about 1100° C. In some embodiments, the oxygen-containing atmosphere may include one or more oxygen-containing gases such as molecular oxygen, ozone, water vapor, hydrogen peroxide, and nitrogen-oxides (e.g., nitric oxide, nitrous oxide, etc.).

Alternatively, in some embodiments, the flowable layer 511 may be formed by reacting vapor phase precursors with co-reactants. The flowable layer 511 may have flow characteristics that can provide consistent fill of substrate gaps of the substrate 101. Subsequently, a post-deposition treatment may be performed, and the flowable layer 511 may be physically densified and/or chemically converted to reduce its flowability. After the post-deposition treatment, the flowable layer 511 may be turned into the processed flowable layer 513. In some embodiments, the densified flowable layer 511 may be considered to be solidified. In some embodiments, physically densifying the flowable layer 511 may involve shrinking the flowable layer 511. In some embodiments, the processed flowable layer 513 may not be shrunk as compared to the flowable layer 511. In some embodiments, the post-deposition treatment may involve substituting chemicals in the flowable layer 511, which may result in denser, higher volume processed flowable layer 513.

In some embodiments, the flowable layer 511 may be flowable silicon oxide, silicon nitride, or silicon oxynitride. In some embodiments, the flowable layer 511 may be silicon carbide or silicon oxycarbide. In some embodiments, chamber pressure for formation of the flowable layer 511 may be between about 1 and 200 Torr, between 10 and 75 Torr, or about 10 Torr. In some embodiments, substrate temperature for formation of the flowable layer 511 may be between about −20° C. and about 100° Q between about −20° C. and 30° C., or between about −10° C. and 10° C.

In some embodiments, the vapor phase precursors may include silicon containing precursors or carbon containing precursors. The co-reactants may include oxidants, catalyst, surfactants, or inert carrier gases.

The silicon containing precursors may include, but are not limited to, silane, disilane, trisilane, hexasilane, cyclohexasilane, alkoxysilanes, aminosilanes, alkylsilanes, tetraisocyanatesilane (TICS), hydrogen silsesquioxane, T8-hydridospherosiloxane, or 1,2-dimethoxy-1,1,2,2-tetramethyldisilane.

The alkoxysilanes may include tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), or tert-butoxydisilane. The aminosilanes may include bis-tert-butylamino silane (BTBAS) or tris(dimethylamino)silane.

The carbon containing precursors may include, but are not limited to, trimethylsilane (3MS), tetramethylsilane (4MS), diethoxymethylsilane (DEMS), dimethyldimethoxysilane, methyl-triethoxysilane (MTES), methyl-trimethoxysilane, methyl-diethoxysilane, methyl-dimethoxysilane, trimethoxymethylsilane, dimethoxymethylsilane, or bis(t-rimethylsilyl)carbodiimide.

The oxidants may include, but are not limited to, ozone, hydrogen peroxide, oxygen, water, alcohols, nitric oxide, nitrous dioxide, nitrous oxide, carbon monoxide, or carbon dioxide. The alcohols may include, for example, methanol, ethanol, or isopropanol.

The catalyst may include, but are not limited to, proton donor catalyst, halogen-containing compounds, mineral acids, bases, chloro-diethoxysilane, methanesulfonic acid, trifluoromethanesulfonic acid, chloro-dimethoxysilane, pyridine, acetyl chloride, chloroacetic acid, dichloroacetic acid, trichloroacetic acid, oxalic acid, benzoic acid, or triethylamine. The proton donor catalyst may include nitric acid, hydrofluoric acid, phosphoric acid, sulphuric acid, hydrochloric acid, bromic acid, carboxylic acid derivatives, ammonia, ammonium hydroxide, hydrazine, or hydroxylamine. The halogen-containing compounds may include dichlorosilane, trichlorosilane, methylchlorosilane, chlorotriethoxysilane, chlorotrimethoxysilane, chloromethyldiethoxysilane, chloromethyldimethoxysilane, vinyltrichlorosilane, diethoxydichlorosilane, or hexachlorodisiloxane. The mineral acids may include formic acid or acetic acid. The bases may include phosphine.

The surfactants may include solvents, alcohols, ethylene glycol, or polyethylene glycol. The surfactants may be used to relieve surface tension and increase wetting of reactants on the substrate surface. The surfactants may also increase the miscibility of the vapor phase precursors with the other reactants.

The solvents may be non-polar or polar and protic or aprotic. The solvents may be matched to the choice of vapor phase precursors to improve the miscibility in the oxidants. Non-polar solvents may include alkanes and alkenes; polar aprotic solvents may include acetones and acetates; and polar protic solvents may include alcohols and carboxylic compounds.

Examples of solvents include, but not limited to, methanol, ethanol, isopropanol, acetone, diethylether, acetonitrile, dimethylformamide, dimethyl sulfoxide, tetrahydrofuran, dichloromethane, hexane, benzene, toluene, isoheptane and diethylether. In some embodiments, the solvents may be introduced prior to the other reactants.

The inert carrier gases may include nitrogen, helium, or argon.

The post-deposition treatment may cross-link and remove terminal groups such as —OH and —H groups in the flowable layer 511, therefore increase the density and hardness of the processed flowable layer 513. The post-deposition treatment be thermal curing, exposure to a downstream or direct plasma, exposure to ultraviolet or microwave radiation, or exposure to another energy source.

While using thermal curing as the means of the post-deposition treatment, the temperature of thermal curing may be between about 200° C. and 600° C. The post-deposition treatment may be performed in an inert environment, an oxidizing environment, a nitridizing environment, or a mix of oxidizing and nitridizing environment. The inert environment may include argon or helium. The oxidizing environment may include oxygen, ozone, water, hydrogen peroxide, nitrous oxide, nitric oxide, nitrogen dioxide, carbon monoxide, carbon dioxide. The nitridizing environment may include nitrogen, ammonia, nitrous oxide, nitric oxide, nitrogen dioxide. The pressure of thermal curing may be between about 0.1 Torr and about 10 Torr.

While using the exposure to a downstream or direct plasma as the means of the post-deposition treatment, the plasma may be an inert plasma or a reactive plasma. The inert plasma may be helium and argon plasma. The reactive plasma may be oxidizing plasma including oxygen and steam, or hydrogen-containing plasma including hydrogen and a diluent such as inert gas. In some embodiments, the temperature during plasma exposure may be about 25° C. or higher. In some embodiments, the temperature during plasma exposure may be between about −15° C. and about 25° C.

In some embodiments, an additional plasma treatment may be performed between the formation of the flowable layer 511 and the post-deposition treatment. The additional plasma treatment may be effective to remove porosity and densify the flowable layer 511 in the substrate gaps if the flowable layer 511 is still in a flowable state. The additional plasma treatment may use a plasma having a primary component of hydrogen, helium, nitrogen, or argon.

Figure 11:
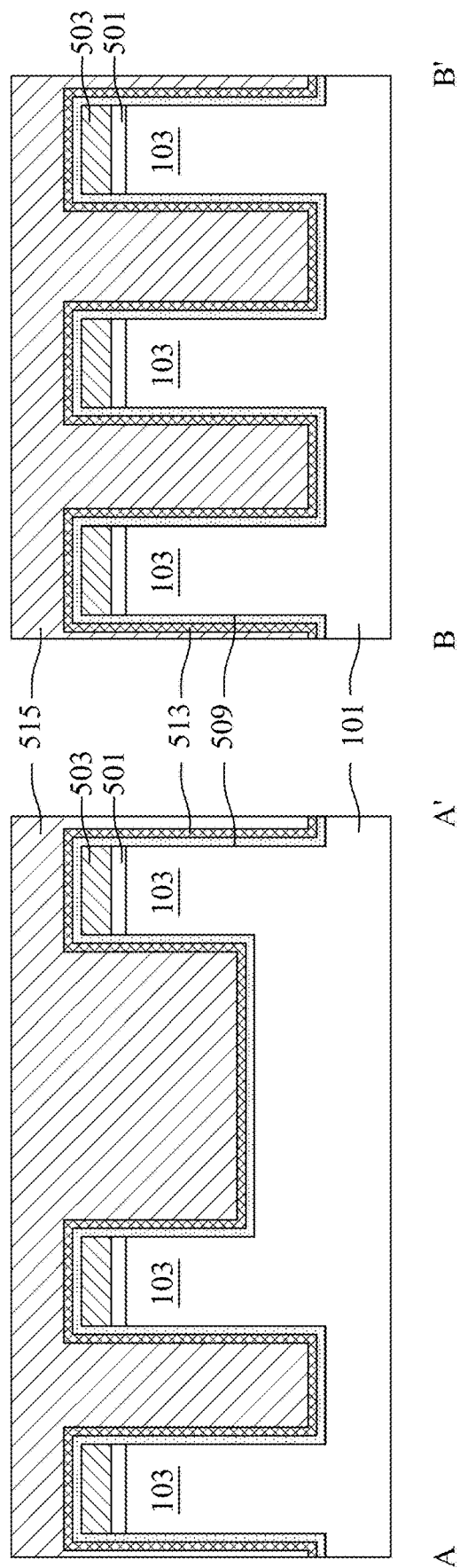
Figure 12:
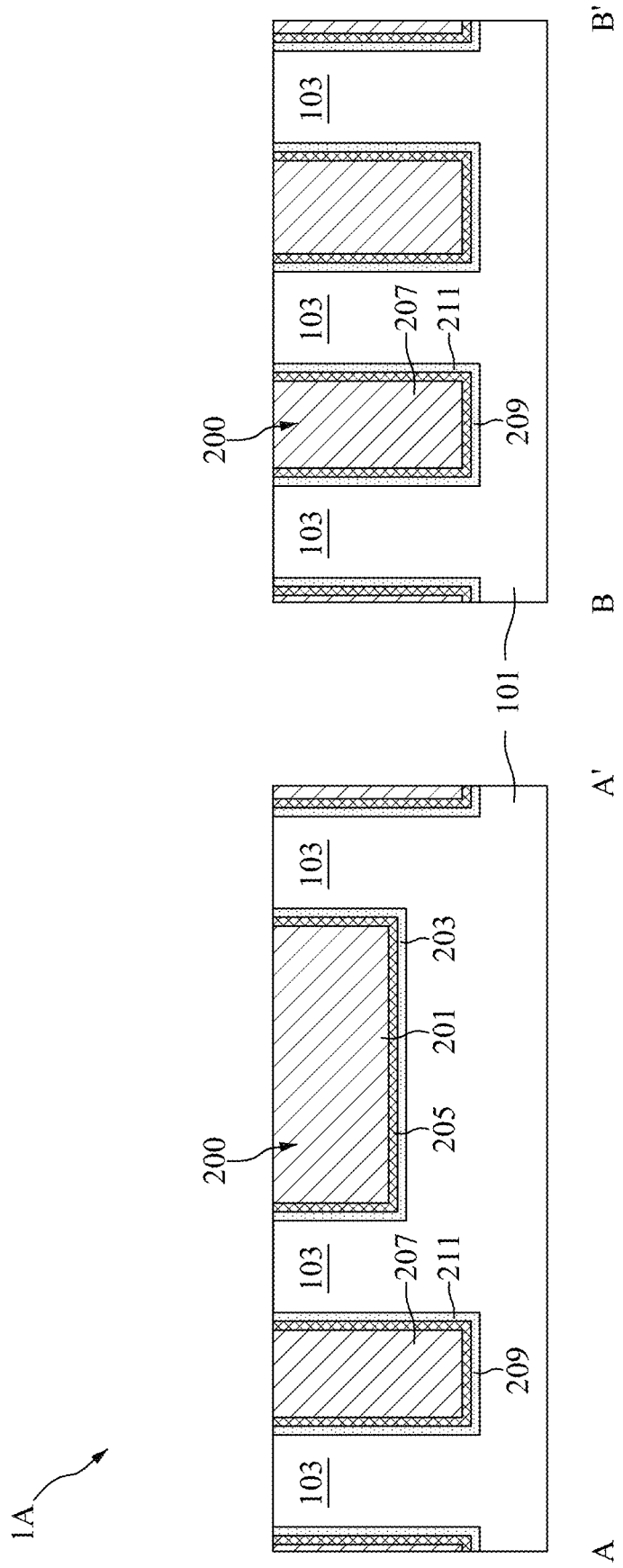

With reference to FIGS. 5, 11, and 12, at step S17, first isolation layers 201 may be formed in the first trenches 505 and second isolation layers 207 may be formed in the second trenches 507.

For convenience of description, only one first isolation layer 201 and one second isolation layer 207 are described.

With reference to FIG. 11, a high aspect ratio process may be performed to deposit a layer of isolation material 515 on the processed flowable layer 513, and the layer of isolation material 515 may completely fill the first trenches 505 and the second trenches 507. The isolation material may be, for example, silicon oxide, silicon nitride, silicon oxynitride, silicon nitride oxide, or fluoride-doped silicate.

The high aspect ratio process may include a first stage and a second stage. The first stage may have a low deposition rate to ensure a more even trench fill with a reduced chance of forming voids. The second stage may have a rapid deposition rate to increase overall production efficiency by decreasing the deposition time. The high aspect ratio process may include both a slower deposition rate stage when the slower deposition rate is advantageous for reducing defects, and a higher deposition rate stage when the high deposition rate results in shorter deposition times.

In some embodiments, the pressure of the high aspect ratio process may be between about 200 Torr and about 760 Torr. In some embodiments, the temperature of the high aspect ratio process may be between about 400° C. and about 570° C.

In some embodiments, a two stage anneal may be performed to the intermediate semiconductor device illustrated in FIG. 11. The first stage of the two stage anneal may be proceeded at a lower temperature in an environment that includes one or more oxygen containing species such as water, oxygen, nitric oxide, or nitrous oxide. The first stage of the two stage anneal may rearrange and strengthen the silicon oxide network to prevent the formation of voids and opening of weak seams in the trenches. In addition, the lower temperature of the first stage of the two stage anneal may keep the oxygen from reacting with the trench walls and other portions of the substrate 101 to form undesirable oxide layers.

The second stage of the two stage anneal may be subsequently proceeded at the higher temperature in an environment that lacks oxygen. The second stage of the two stage anneal may rearrange the structure of the isolation material 515 and drive out moisture, both of which increase the density of the isolation material 515. The environment may be, for example, substantially pure nitrogen, a mixture of nitrogen and noble gases (e.g., helium, neon, argon, or xenon), or a substantially pure noble gas. The environment may also include reducing gases such as hydrogen or ammonia. The second stage of the two stage anneal may facilitate the high-temperature densification without the oxidation of the substrate 101.

With reference to FIG. 12, a planarization process, such as chemical mechanical polishing, may be performed until the top surface of the substrate 101 is exposed to remove excess material, provide a substantially flat surface for subsequent processing steps, and concurrently form the first isolation layers 201 and the second isolation layers 207. After the planarization process, the layer of adhesion material 509 may be turned into a first adhesion layer 203 in the first trench 505 and a second adhesion layer 209 in the second trench 507, respectively. The processed flowable layer 513 may be turned into a first treated flowable layer 205 in the first trench 505 and a second treated flowable layer 211 in the second trench 507, respectively. The first isolation layer 201, the first adhesion layer 203, the first treated flowable layer 205, the second isolation layer 207, the second adhesion layer 209, and the second treated flowable layer 211 together form an isolation structure 200.

Figure 13:
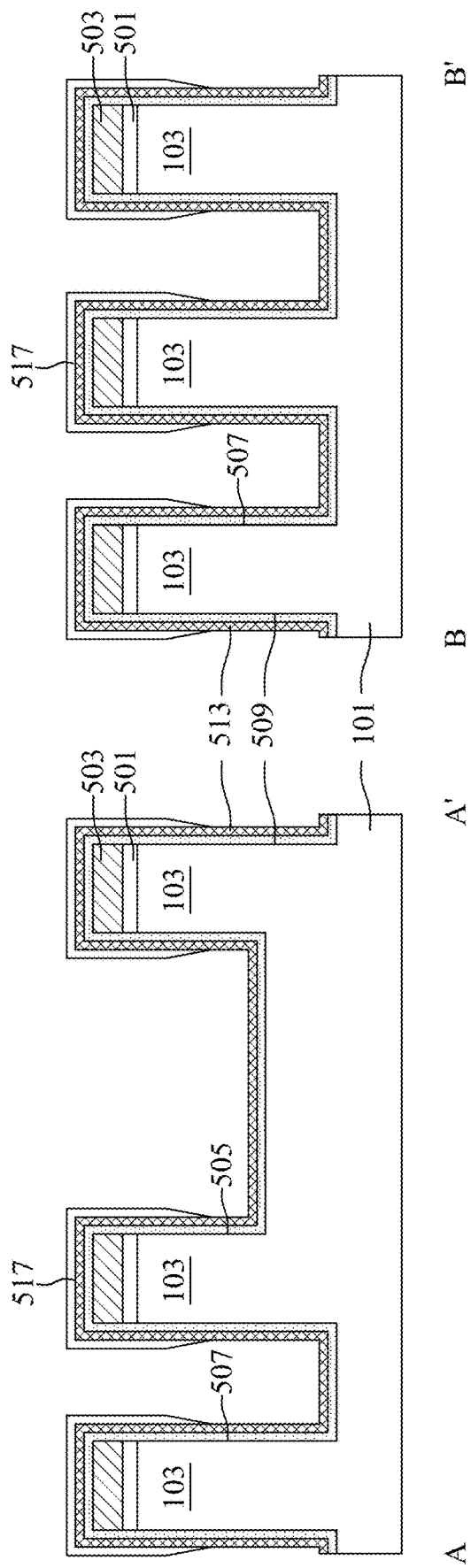
FIGS. 13 to 15 are schematic cross-sectional view diagrams taken along the line A-A' and B-B' in FIG. 6 illustrating part of a flow for fabricating a semiconductor device in accordance with one embodiment of the present disclosure.
Figure 14:
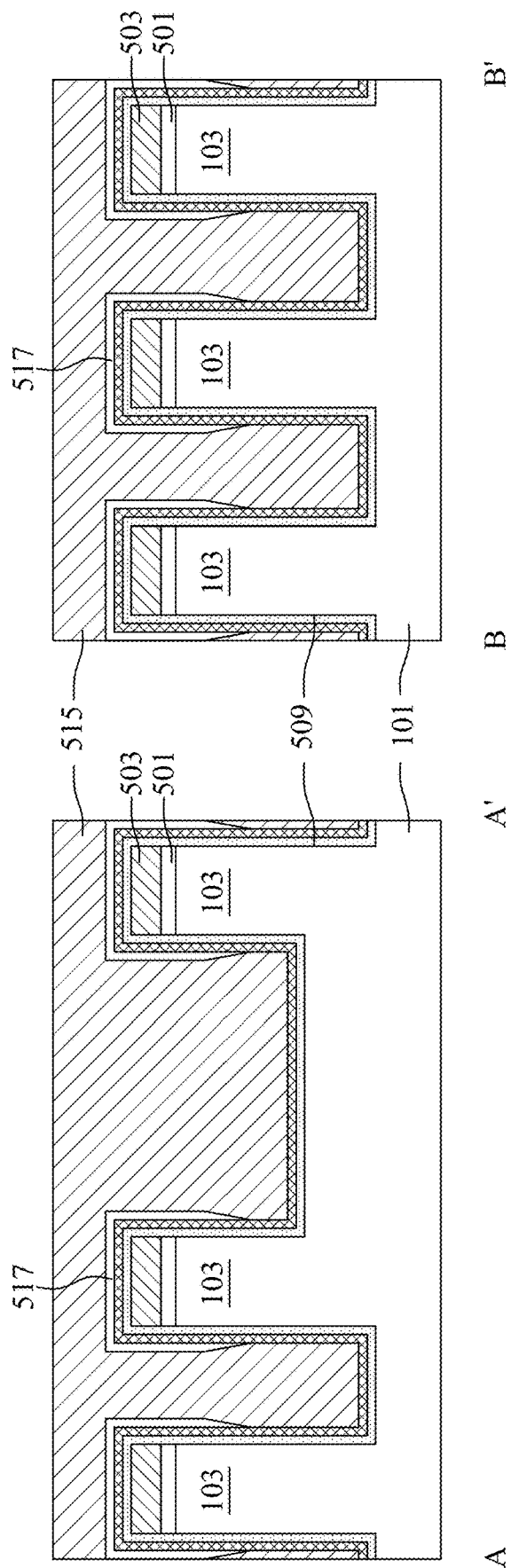
Figure 15:
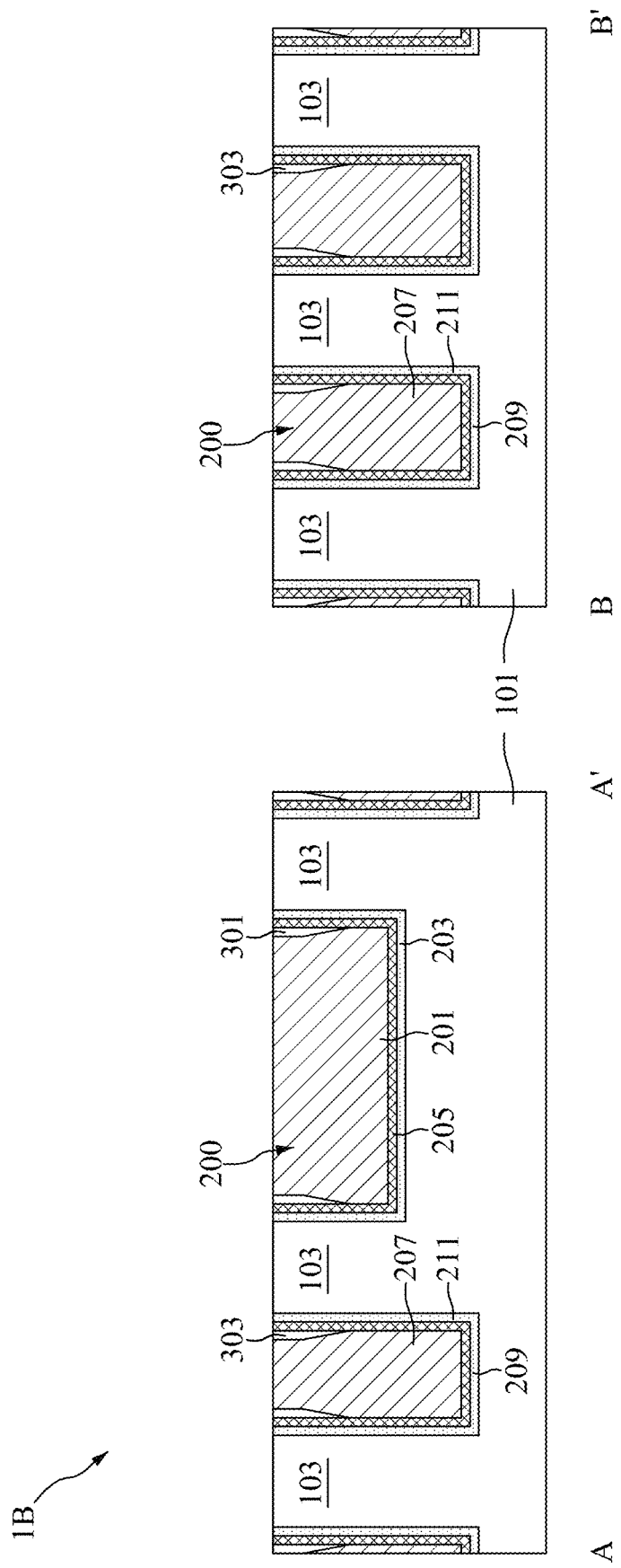

FIGS. 13 to 15 are schematic cross-sectional view diagrams taken along the line A-A' and B-B' in FIG. 6 illustrating part of a flow for fabricating a semiconductor device 1B in accordance with one embodiment of the present disclosure.

With reference to FIG. 13, an intermediate semiconductor device may be fabricating with a procedure similar to that illustrated in FIGS. 6 to 10. Layers of adjustment material 517 may be formed covering the top surface of the processed flowable layer 513 and the upper portions of the sidewalls of the processed flowable layer 513. The adjustment material 517 may be, for example, aluminum oxide, hafnium oxide, zirconium oxide, titanium oxide, titanium nitride, tungsten nitride, silicon nitride, or silicon oxide.

The layers of adjustment material 517 may be formed by a deposition process such as an atomic layer deposition method precisely controlling an amount of a first precursor of the atomic layer deposition method.

In some embodiments, when the layers of adjustment material 517 are formed of aluminum oxide, the first precursor of the atomic layer deposition method may be trimethylaluminum and a second precursor of the atomic layer deposition method may be water or ozone.

In some embodiments, when the layers of adjustment material 517 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the layers of adjustment material 517 are formed of zirconium oxide, the first precursor of the atomic layer deposition method may be zirconium tetrachloride and the second precursor of the atomic layer deposition method may be water or ozone.

In some embodiments, when the layers of adjustment material 517 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the layers of adjustment material 517 are formed of titanium nitride, the first precursor of the atomic layer deposition method may be titanium tetrachloride and ammonia.

In some embodiments, when the layers of adjustment material 517 are formed of tungsten nitride, the first precursor of the atomic layer deposition method may be tungsten hexafluoride and ammonia.

In some embodiments, when the layers of adjustment material 517 are formed of silicon nitride, the first precursor of the atomic layer deposition method may be silylene, chlorine, ammonia, and/or dinitrogen tetrahydride.

In some embodiments, when the layers of adjustment material 517 are formed of silicon oxide, the first precursor of the atomic layer deposition method may be silicon tetraisocyanate or $CH_3OSi(NCO)_3$ and the second precursor of the atomic layer deposition method may be hydrogen or ozone.

With reference to FIG. 14, a procedure similar to that illustrated in FIG. 11 may be performed. Due to the presence of the layers of adjustment material 517, the deposition rate of the isolation material 515 on the sidewalls of the first trench 505 and the second trench 507 may be reduced. Hence, the deposition rate of the isolation material 515 on the sidewalls of the first trench 505 and the second trench 507 and the deposition rate of the isolation material 515 on the bottom surfaces of the first trench 505 and the second trench 507 may become close to each other. As a result, the first trench 505 and the second trench 507 may be filled without any void formation near the bottom surfaces of the first trench 505 and the second trench 507. The yield of the semiconductor device 1C may be improved.

With reference to FIG. 15, a procedure similar to that illustrated in FIG. 12 may be performed. The layers of adjustment material 517 may be turned into first adjustment layers 301 in the first trench 505 and second adjustment layers 303 in the second trench 507, respectively.

One aspect of the present disclosure provides a semiconductor device including a substrate, a first isolation layer positioned in the substrate, a first treated flowable layer positioned between the first isolation layer and the substrate, a second isolation layer positioned in the substrate, and a second treated flowable layer positioned between the second isolation layer and the substrate. A width of the first isolation layer is greater than a width of the second isolation layer, and a depth of the first isolation layer is less than a depth of the second isolation layer.

Another aspect of the present disclosure provides a method for fabricating a semiconductor device including providing a substrate, forming a first trench and a second trench in the substrate, conformally forming a flowable layer on a top surface of the substrate and in the first trench and the second trench, performing a thermal process to turn the flowable layer into a processed flowable layer, forming a layer of isolation material on the processed flowable layer to completely fill the first trench and the second trench, and performing a planarization process to turn the layer of isolation material into a first isolation layer in the first trench and a second isolation layer in the second trench, and turn the processed flowable layer into a first treated flowable layer in the first trench and a second treated flowable layer in the second trench. The first trench and the second trench have different aspect ratios.

Due to the design of the semiconductor device of the present disclosure, the first treated flowable layer 205 and the second treated flowable layer 211 may fill small substrate gaps without forming voids or weak seams. Therefore, the yield of the semiconductor device 1A may be improved. In addition, due to the flowable characteristic of the flowable layer 511, the flowable layer 511 can concurrently formed in different dimensions of trenches (e.g., the first trench 505 and the second trench 507).

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a first trench and a second trench in the substrate, wherein a width of the first isolation layer is greater than a width of the second isolation layer, and a depth of the first isolation layer is less than a depth of the second isolation layer;
   conformally forming a flowable layer on a top surface of the substrate and in the first trench and the second trench;
   performing a thermal process to turn the flowable layer into a processed flowable layer;
   forming a layer of isolation material on the processed flowable layer to completely fill the first trench and the second trench; and
   performing a planarization process to turn the layer of isolation material into a first isolation layer in the first trench and a second isolation layer in the second trench, and turn the processed flowable layer into a first treated flowable layer in the first trench and a second treated flowable layer in the second trench;
   wherein the first trench and the second trench have different aspect ratios.

2. The method for fabricating the semiconductor device of claim 1, further comprising a step of conformally forming a layer of adhesion material on the top surface of the substrate and in the first trench and the second trench before the step of forming the flowable layer on the top surface of the substrate and in the first trench and the second trench, wherein the flowable layer is formed on the layer of adhesion material.

3. The method for fabricating the semiconductor device of claim 2, wherein the flowable layer comprises compounds having unsaturated bonding.

4. The method for fabricating the semiconductor device of claim 2, wherein the processed flowable layer comprises silicon oxide, silicon nitride, silicon oxynitride, or silicon nitride oxide.

5. The method for fabricating the semiconductor device of claim 4, wherein the layer of adhesion material comprises silicon oxide.

6. The method for fabricating the semiconductor device of claim 5, wherein the flowable layer is formed from flowable precursors, and the flowable precursor are silane, disilane, trisilane, hexasilane, cyclohexasilane, methylsilane, tri-ethoxysilane, or bis-tert-butylamino silane.

7. The method for fabricating the semiconductor device of claim 6, wherein the flowable precursors are mixed with an oxidant to form the flowable layer, the oxidant is peroxide, ozone, oxygen, or steam.

8. The method for fabricating the semiconductor device of claim 2, wherein a process temperature of the thermal process is between about 100° C. and about 400° C.

9. The method for fabricating the semiconductor device of claim 2, wherein a substrate temperature during the step of conformally forming a flowable layer on the top surface of the substrate and in the first trench and the second trench is less than 120° C.

10. The method for fabricating the semiconductor device of claim 2, wherein the layer of isolation material comprises silicon oxide, silicon nitride, silicon oxynitride, silicon nitride oxide, or fluoride-doped silicate.

* * * * *